United States Patent
Sung

(10) Patent No.: US 6,303,436 B1
(45) Date of Patent: Oct. 16, 2001

(54) METHOD FOR FABRICATING A TYPE OF TRENCH MASK ROM CELL

(75) Inventor: Kuan-Chou Sung, Taoyuan (TW)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 09/400,178

(22) Filed: Sep. 21, 1999

(51) Int. Cl.$^7$ .................................................. H01L 21/336
(52) U.S. Cl. ........................ 438/257; 438/548; 438/923; 438/561
(58) Field of Search .................... 438/381, 561, 438/923, 548, 257

(56) References Cited

U.S. PATENT DOCUMENTS

| | | | | |
|---|---|---|---|---|
| 5,595,927 | * | 1/1997 | Chen et al. ........................... | 438/270 |
| 5,998,261 | * | 12/1999 | Hofmann et al. ..................... | 438/257 |
| 6,064,101 | * | 5/2000 | Krautschneider et al. .......... | 257/390 |
| 6,069,058 | * | 5/2000 | Hong ..................................... | 438/436 |

* cited by examiner

Primary Examiner—Amir Zarabian
Assistant Examiner—Beth E. Owens

(57) ABSTRACT

A method for fabricating a type of Trench Mask ROM cell comprises steps including: providing a substrate doped lightly with p-type dopant, sequentially forming a pad oxide layer and a nitride layer on the substrate; etching back the pad oxide layer, the nitride layer and the substrate to form plural trenches; a gate oxide layer being formed on surfaces of each trench; then, implanting n$^+$-type ions into the substrate beneath the pad oxide layer and between each two adjacent trenches; and, forming a polysilicon layer on the gate oxide and pad oxide; finally, implanting n$^+$-type ions into the substrate beneath the gate oxide layer on bottoms of selected trenches. And, it is appreciated that the sequence of the formation of plural trenches and implanting n$^+$-type ions into substrate between each trench can be reversed in the embodiment without affecting subsequent steps.

12 Claims, 6 Drawing Sheets

METHOD FOR FABRICATING A TYPE OF TRENCH MASK ROM CELL

BACKGROUND OF INVENTION

1. Field of the Invention

The present invention generally relates to a method of fabrication of a Mask ROM (Read Only Memory), and more precisely to a method of fabrication of a new type of Trench Mask ROM.

2. Background of the Related Art

As the complexity and performance of ICs increase, more processing steps are needed to fabricate them. Four or five mask levels were quite adequate for primitive ICs in the 1970s, whereas 16-Mb (ultra large-scale integration; ULSI) memory chips require more than twenty mask levels. For bit densities of up to one megabit, planar-type storage capacitors are used.

Read Only Memory is so named because its cells can read data only from the memory cells. The ROM can be distinguished as Mask ROM, PROM (Programmable ROM), EPROM (Erasable Programmable ROM) and EEPROM (Electrically Erasable Programmable ROM) due to what method a ROM uses to store data. The Mask ROM is the most fundamental ROM.

The fabrication of a typical planar type of Mask ROM is shown as follows. The description of the process sequence for forming a planar type of Mask ROM is as shown, in FIG 1a to FIG 1e. Referring to FIG. 1a, a portion of the substrate 100 is lightly doped with a p-type dopant. Furthermore, there are field-oxide areas 106 on both sides of the top portion of the substrate 100. A photo resist 104 is formed on the outer surface of the substrate 100 to define plural doped regions 102. The plural doped regions 102 are formed using ion-implanting technique, wherein the plural doped regions 102 are implanted with $n^+$-type ion, such as As or P. Photo resist 104 is removed. Photo resist 104 is used to define the doped regions 102. Referring to FIG. 1b, after removing the photo resist 104, boron ions are implanted 107 into the substrate to form cell isolation region 108. The cell isolation region 108 is used for suppressing the leakage. Referring to FIG. 1c, a gate oxide layer 110 is formed on the substrate 100 and the doped regions 102. And, a polysilicon layer 112 is formed sequentially on the gate oxide layer 110. Referring to FIG. 1d, a photo mask 114 is used during a boron ion-implanting step 119, wherein the photo mask 114 is used to define a coding cell for forming a Mask ROM. Then, a Mask ROM is formed with some high-logic-level regions. As shown in FIG 1e, there is a fixed threshold voltage between two adjacent doped regions 102. Accordingly, the doped regions 102 doped with $n^+$-type dopant and the doped regions 116 doped with boron ions would increase the threshold voltage. Namely, a higher threshold voltage relates to a high-logic-level. Conversely, a low-logic-level is one pair of two of the adjacent doped regions 102 which contains an undoped region 118 between the two adjacent doped regions 102.

However, as component density has increased, the amount of charge needed for a sufficient noise margin remains fixed. A device is composed of huge number of components. Further, a chip contains a lot of devices. The typical planar type of Mask ROM can't satisfy the reductions for the device scale. Hence, it is difficult to compose a huge number of devices on a small chip. Furthermore, as the size of device is reduced, the distance between two adjacent components is so close as to cause the current leakage on the surface of the device. Hence, the current leakage and small-scale integration lead the fabrication of the mask ROM to be restricted. Therefore, in order to reduce leakage and cell size, and form large-scale integration a new type of Trench Mask ROM cell is needed.

SUMMARY OF THE INVENTION

Accordingly, it is an object of the present invention to provide a new type of Trench Mask ROM cell and the fabricating method thereof. The Trench Mask ROM cell can achieve purposes such as forming a large-scale integration, reducing current leakage and the size of the device.

Briefly described, the present invention relates to a method for fabricating a Trench Mask ROM cell. An embodiment of the method comprises the steps as described as follows. First, a substrate lightly with p-type dopant is provided. A dielectric layer and a nitride layer are formed sequentially on the substrate. Plural trenches are formed using well-known etching techniques. After etching back the nitride layer and the oxide layer, the plural trenches are formed on the substrate. Then, a gate oxide layer is deposited on the surface of each trench. After the nitride layer is removed, $n^+$-type ions are implanted into the top portion of the substrate between each trench, wherein the doped regions are beneath the pad oxide layer. These doped regions are used for being bit lines of the Mask ROM. The $n^+$-type ions are arsenic or phosphorus ions. Further, a polysilicon layer is formed on the gate oxide layer. Finally, parts of trenches are implanted with $n^+$-type ions for defining coding cells of a Trench Mask ROM by using a mask.

In another embodiment, the steps for forming plural trenches and implanting $n^+$-type ions to form doped regions are reversed. These two methods can yield the same result for fabricating a Trench Mask ROM. By using these methods, the purposes of forming a large-scale integration, suppressing current leakage and reducing size of the device can be achieved.

DETAILED DESCRIPTION OF THE EMBODIMENT

Figure 1A:
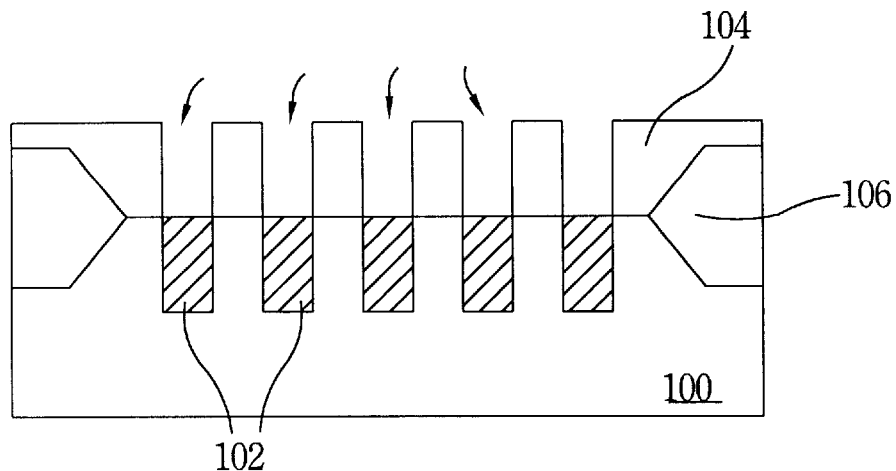
FIG. 1a shows the As or P ion implantation step of prior art.
Figure 1B:
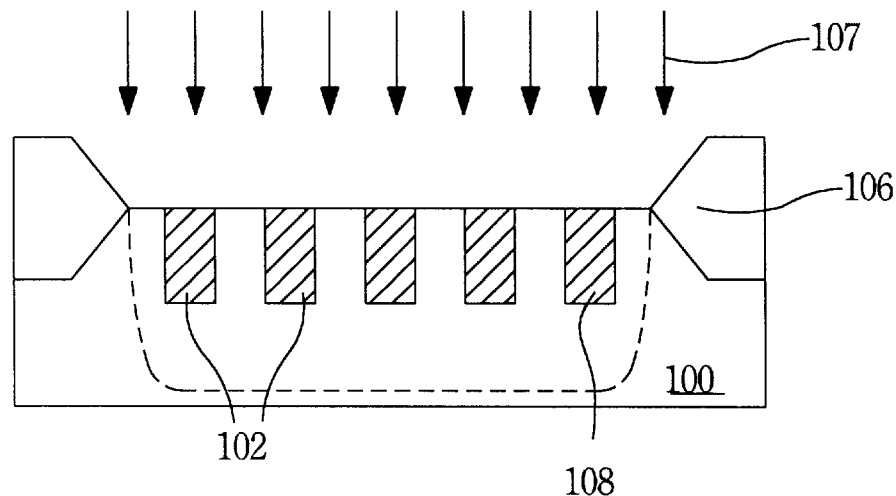
FIG. 1b shows the step of forming an isolation region by doping boron ions into a P-well of prior art.
Figure 1C:
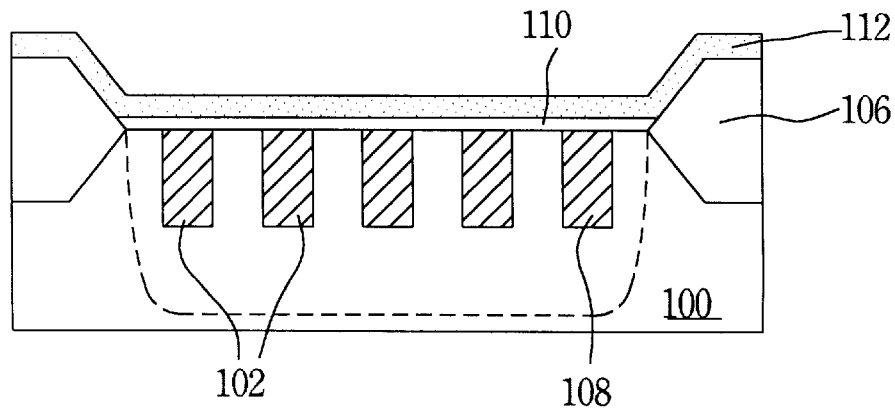
FIG. 1c shows the step of forming an oxide layer and polysilicon layer of prior art.
Figure 1D:
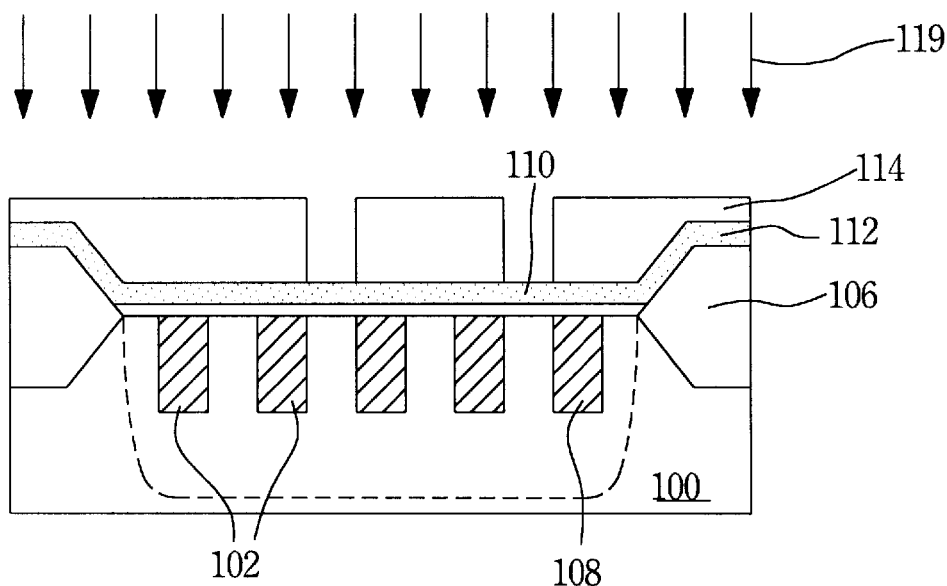
FIG. 1d shows the step of forming a Mask ROM circuit of prior art.
Figure 1E:
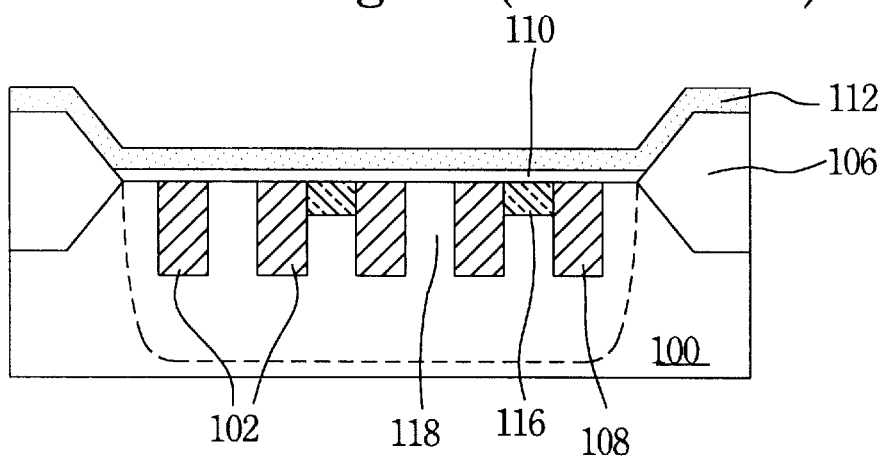
FIG. 1e shows a Mask ROM cell cross section of prior art.
Figure 2A:
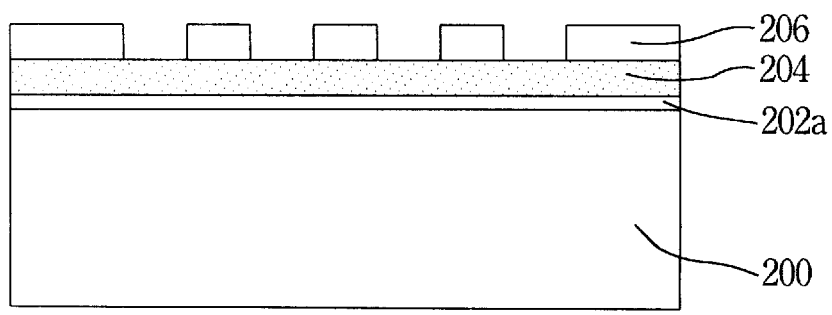
FIG. 2a is a schematic cross-sectional view showing a process for etching plural trenches of the preferred embodiment in the present invention.
Figure 2B:
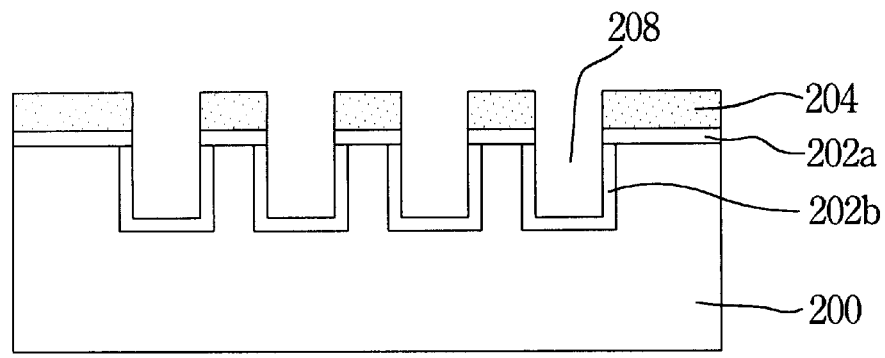
FIG. 2b is a schematic cross-sectional view showing a process for depositing a dielectric layer on the plural trenches after removing the photo resist of the preferred embodiment in the present invention.

The following detailed description relates to a method for forming a new type of trench mask ROM cell in the present invention. Referring to FIG. 2a, a silicon substrate 200 is provided for fabricated devices. In the embodiment, the substrate 200 is preferably doped with a p-type dopant. A pad oxide layer 202a is formed on the substrate 200. The pad oxide layer 202a is composed of a silicon oxide using a process of thermal oxidization or deposition etc. In the embodiment, the thickness of the pad oxide layer 202a is about 300 to 600 angstroms. Then, a nitride layer 204 is formed on the pad oxide layer 202a. The nitride layer 204 is used to protect the oxide layer 202a during later etching steps. The nitride layer 204 has a thickness of about 1,000 to 2,000 angstroms. A photo resist 206 is formed on the nitride layer 204, wherein the photo resist 206 is used to define regions for etching to form plural trenches. Plural trenches 208, as shown in FIG. 2b are formed on the substrate 200 by well-known etching techniques. In this step, the depth of the trenches can be adjusted by using different recipes. That different depths of the trench 208 can cause different thresholds voltage between two adjacent doped regions will be described as follows. Further, the photo resist 206 is removed, as shown in FIG. 2b.

Figure 2C:
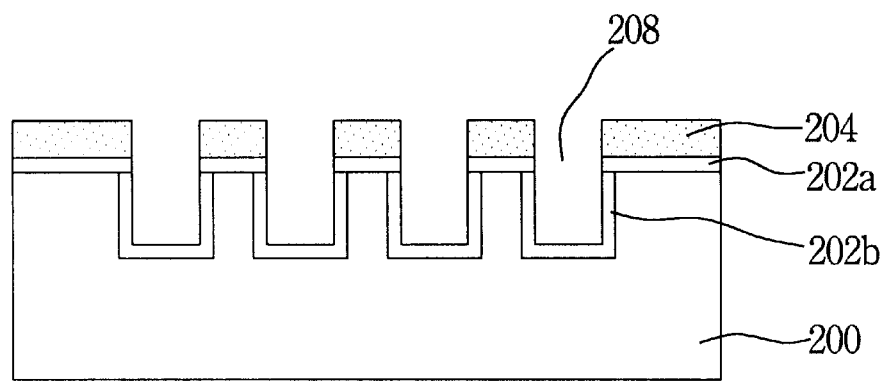
FIG. 2c is a schematic cross-sectional view showing a process for implanting As or P ions into regions which are defined by using photo resist of the preferred embodiment in the present invention.
Figure 2D:
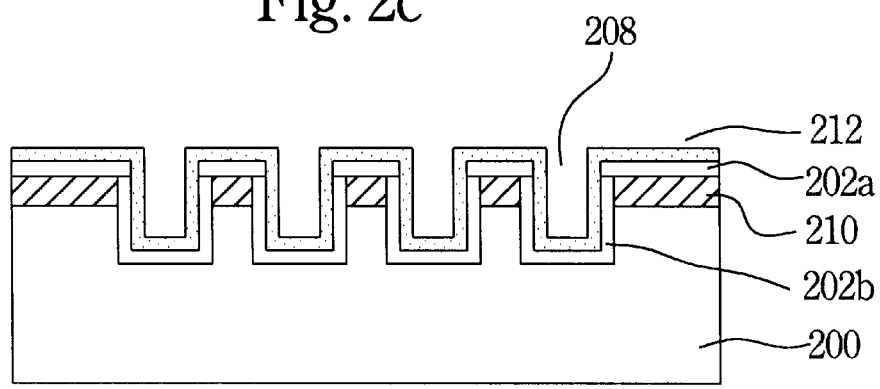
FIG. 2d is a schematic cross-sectional view showing a process for depositing a polysilicon layer on the dielectric layer of the preferred embodiment in the present invention.
Figure 2E:
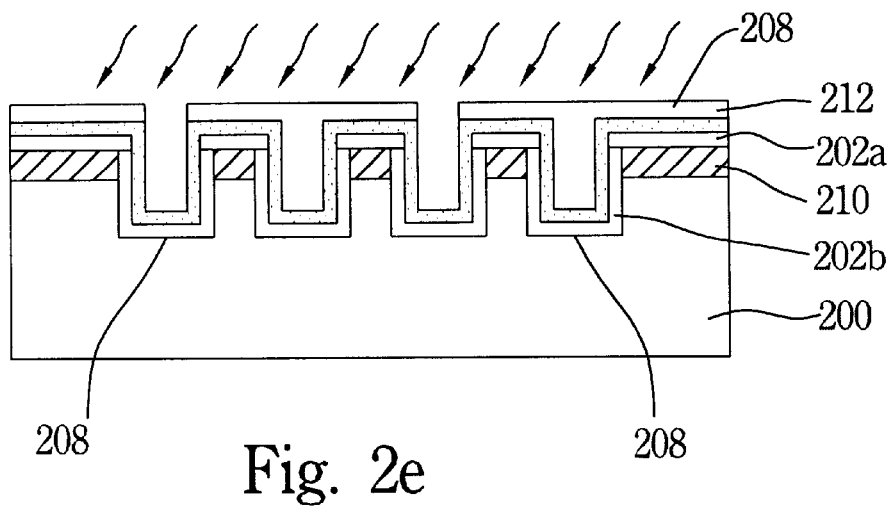
FIG. 2e is a schematic cross-sectional view showing a process for forming a Trench Mask ROM of the preferred embodiment in the present invention.

Referring to FIG. 2c, a gate oxide layer 202b is formed on the surface of each trench by using thermal oxidization. Referring to FIG. 2d, the nitride layer 204 is removed by using phosphoric acid ($H_3PO_4$) at a temperature between 150 to 200° C. After the nitride layer 204 is removed, $n^+$-type ions are doped into the substrate 200 beneath the pad oxide layer 202a to form plural doped regions 210. More precisely speaking, the doped regions 210 are positioned in the top portion of substrate 200 between every trench 208. Furthermore, the $n^+$-type ions are arsenic or phosphorus ions, wherein the implanting energy is about 40 KeV to 100 KeV for implanting arsenic ion and 30 KeV to 80 KeV for phosphorus ion. The thickness of the doped regions 210 are about 1,500 to 3,000 angstroms. A polysilicon layer or a polysilicon layer doped with an n-type dopant 212 is formed on the surface of the trenches 208 and the pad oxide layer 202a. The polysilicon layer 212 is then patterned to form word lines of the present invention. The polysilicon layer 212 is formed using a LPCVD technique at a temperature of 450 to 650° C. and doped in situ with $n^+$-type dopant. As shown in FIG. 2e, a photo resist 214 is formed on the polysilicon layer 212. And, some exposed trenches 208 are used for defining a coding region of the memory cell. Consequently, $n^+$-type ions are implanted into the substrate 200 beneath the gate oxide layer 202b and on the bottoms of the exposed trenches 208. In this ion-implanting step, the implanting energies are 150 to 1,000 KeV for arsenic ion and 90 to 1,000 KeV for phosphorus ion. These high implanting energies can drive the ions implanted through the gate oxide layer 202b to the silicon substrate 200. Thus, the second doped region can be formed. The doped regions of the exposed trenches can be used to reduce threshold voltage of two adjacent doped regions 210. In other words, the photo resist 214 is used for forming a coded Trench Mask ROM.

Figure 3:
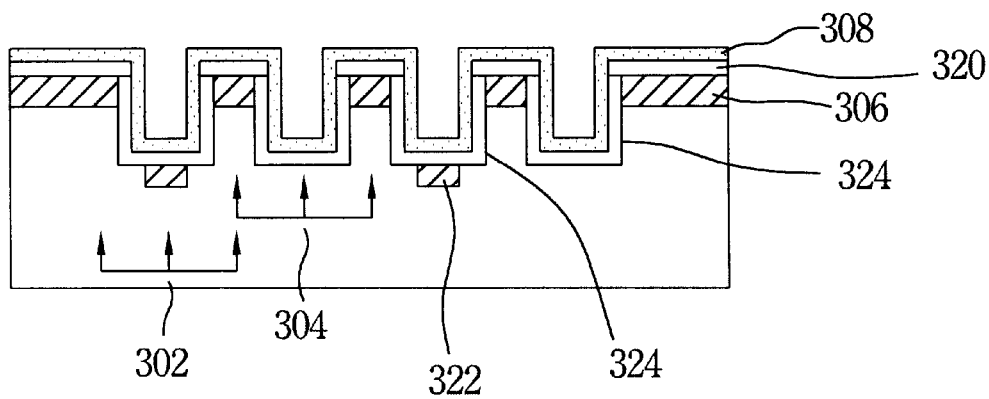
FIG. 3 is a schematic cross-sectional view of the present invention of the Trench Mask ROM.

As shown in FIG. 3, a Trench Mask ROM includes low-logic-level regions 302 and high-logic-level regions 304. The low-logic-level regions 302 refer to those regions having a low threshold voltage. Conversely, the high-logic-level regions 304 refer to those regions having a high threshold voltage. The threshold voltage between two adjacent doped regions depends on the depth and the conductivity of the trench of the two adjacent doped regions. The threshold voltage is increased if the depth of the trench becomes deeper. The threshold voltage is reduced if the trench is doped with the same conductive dopant as the doped regions. The high threshold voltage and low threshold voltage are respectively the "off" state and the "on" state. Thus, the Trench mask ROM is coded. The low-logic-level regions 302 are equivalent to a device of low threshold $V_l$ and treated as an "on" state. Conversely, the high-logic-level regions 304 are equivalent to a device of high threshold $V_h$ and treated as an "off" state. Finally, the regions 306 are referred to bit lines, and the polysilicon layer 308 is a word line on a device. Note that the reference numbers 320, 322 and 324 are respectively assigned to the pad oxide layer, doped areas, and the bottom of the trenches.

Figure 4A:
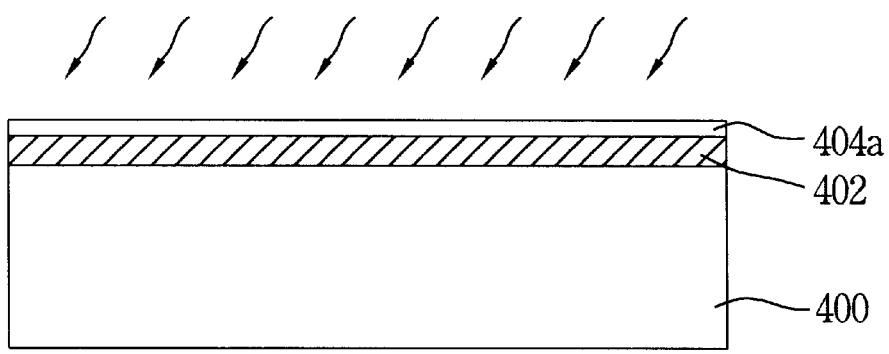
FIG. 4a is a schematic cross-sectional view showing a process for implanting As or P ions into a semiconductor substrate of a second embodiment in the present invention.
Figure 4B:
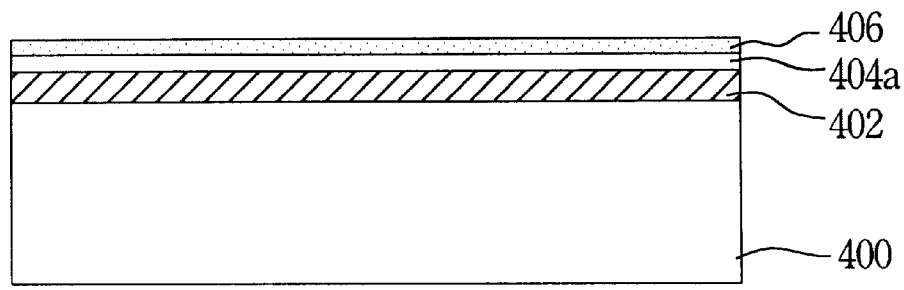
FIG. 4b is a schematic cross-sectional view showing a process for depositing a silicon nitride layer of a second embodiment in the present invention.
Figure 4C:
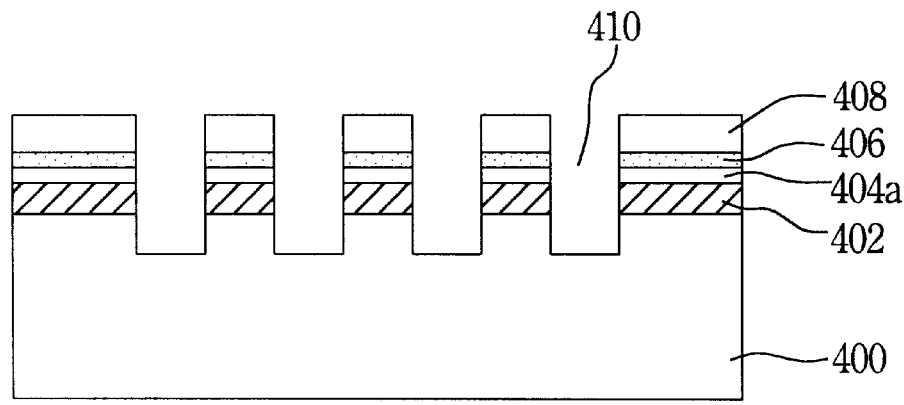
FIG. 4c is a schematic cross-sectional view showing a process for etching plural trenches of a second embodiment in the present invention.
Figure 4D:
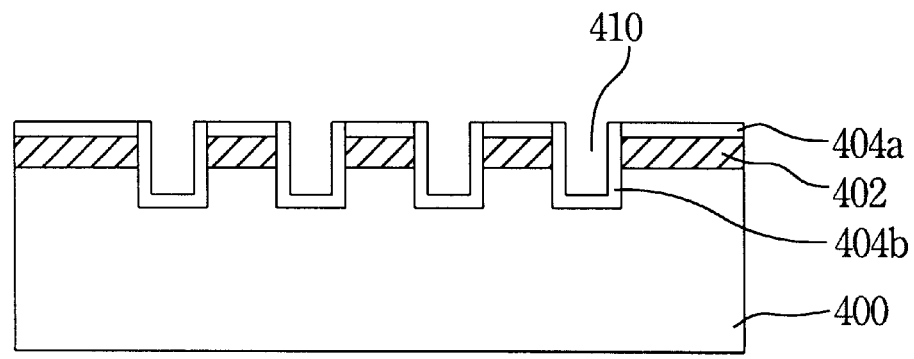
FIG. 4d is a schematic cross-sectional view showing a process for depositing a dielectric layer on the plural trenches of a second embodiment in the present invention.
Figure 4E:
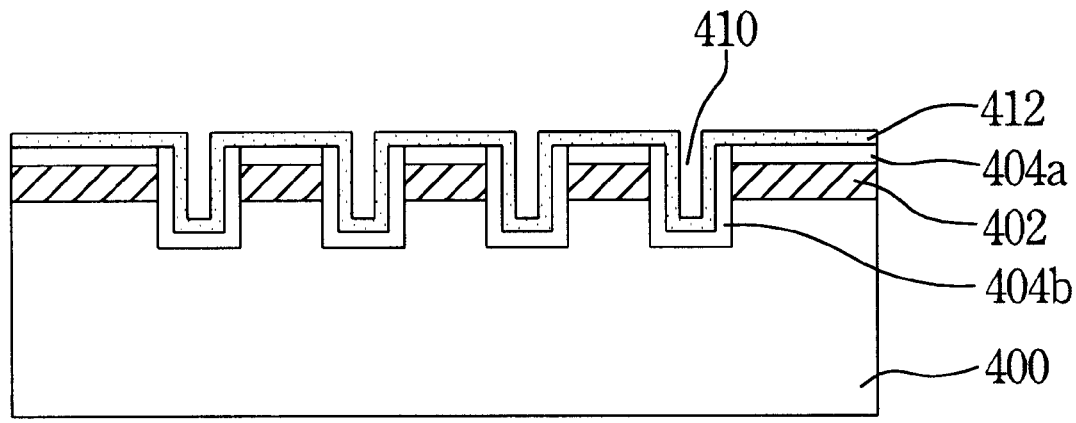
FIG. 4e is a schematic cross-sectional view showing a process for deopsiting a polysilicon layer on the dielectric layer of a second embodiment in the present invention.
Figure 4F:
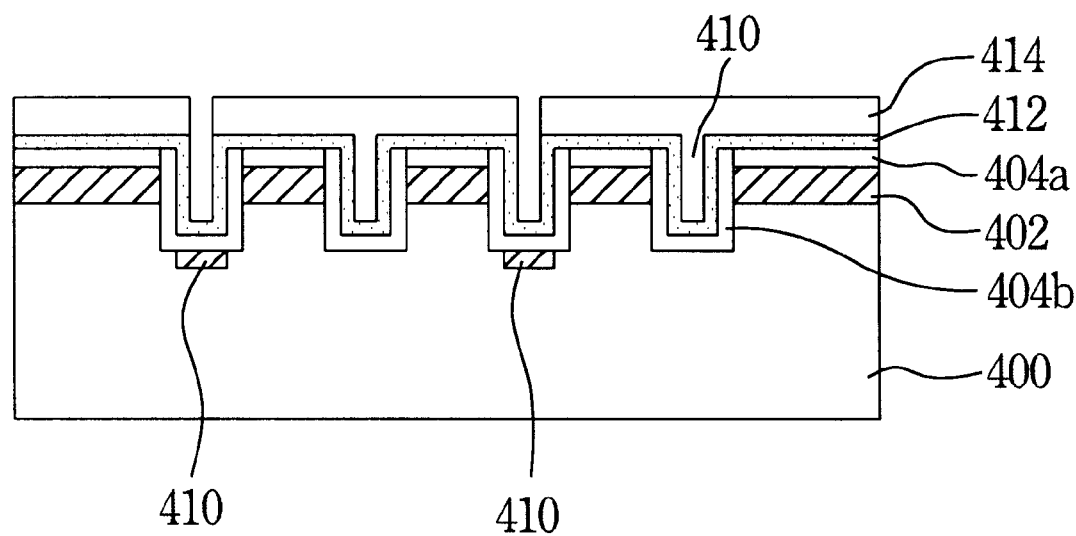
FIG. 4f is a schematic cross-sectional view showing a process for forming a Trench Mask ROM of a second embodiment in the present invention.

Another embodiment in the present invention for forming a Trench Mask ROM cell is described as follows and taken in conjunction with the accompanying drawings FIG. 4a to FIG. 4f. Referring to FIG. 4a, a substrate 400 is provided for fabricating the Trench Mask ROM. In the embodiment, the substrate 400 is lightly doped with a P-type dopant, wherein the substrate 400 further comprises a pad oxide layer 404a on its surface. The pad oxide layer 404a in the embodiment can be a silicon oxide layer, wherein the pad oxide layer 404a is formed in a similar manner as described above in the first embodiment. The thickness of the pad oxide layer 404a is about 300 to 600 angstroms. The $n^+$-type ions are doped into the substrate 400, and a doped layer 402 is formed beneath the pad oxide layer 404a. The $n^+$-type ions are arsenic or phosphorus ions. Again, the implanting energy is about 40 KeV to 100 KeV for arsenic ion and 30 KeV to 80 KeV for phosphorus ion during the implanting step. The thickness of $n^+$-type layer is about 1,500 to 3,000 angstroms. Referring to FIG. 4b, a nitride layer 406 is formed on the pad oxide layer 404a. Similarly, the thickness of the nitride layer 406 is about 1,000 to 2,000 angstroms. Referring to FIG. 4c, a photo resist 408 is used to define etching regions. Plural trenches 410 are formed on the substrate 400 by using etching techniques. As shown in FIG. 4d, the photo resist 408 and the nitride layer 406 are removed as previously discussed. Then, a gate oxide layer 404b is formed on the surface of the trenches 410. Referring to FIG. 4e, a polysilicon layer 412 is formed on the pad oxide layer 404a and the gate oxide layer 404b. And, as shown in FIG. 4f, a photo resist 414 is formed on the polysilicon layer 412. The photo resist 414 is used to define a coding region of memory cell.

Then, some parts of trenches are implanted with n+-type ions to form n+ doped regions 410. Again, in this ion-implanting step wherein the implanting energies are 150 to 1,000 KeV for arsenic ion and 90 to 1,000 KeV for phosphorus ion. A "Trench Mask ROM Cell" is thus formed, as has been shown in FIG. 3.

As is understood by a person that skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method for fabricating a type of Trench Mask ROM cell on a substrate, wherein said method comprises the steps in the following sequence:

forming a pad oxide layer on said substrate;

forming a nitride layer on said pad oxide layer;

forming plural trenches on said substrate by etching back said pad oxide layer, said nitride layer and said substrate;

removing said nitride layer;

forming a gate oxide layer on an outer surface of each said trench;

forming plural first doped regions in said substrate, wherein said first doped regions are beneath said pad oxide layer and between two adjacent trenches, with said first doped regions acting as bit lines of said Trench Mask ROM cell;

forming a polysilicon layer on an outer surface of said pad oxide layer and said gate oxide layer, wherein said polysilicon layer is a word line of said Trench Mask ROM cell; and forming plural second doped regions in said substrate beneath said gate oxide layer and beneath said gate oxide layer on bottoms of selected trenches to form coding regions of said Trench Mask ROM cell.

2. The method according to claim 1, wherein said first and second doped regions are doped with ions selected from a group consisting of arsenic and phosphorus ions.

3. The method according to claim 1, wherein said first and second doped regions are formed using ion-implanting steps.

4. The method according to claim 3, wherein the energies in said ion-implanting step for forming said first doped regions are about 40 to 100 KeV for arsenic ions and 30 to 80 KeV for phosphorus ions.

5. The method according to claim 3, wherein the energies in said ion-implanting step for forming said second doped regions are about 150 to 1,000 KeV for arsenic ions and 90 to 1,000 KeV for phosphorus ions.

6. The method according to claim 1, wherein a thickness of said gate oxide layer is about 50 to 200 angstroms.

7. A method for fabricating a type of Trench Mask ROM cell on a substrate, wherein said method comprises the steps in the following sequence:

forming a pad oxide layer on said substrate;

forming a first doped region beneath said pad oxide layer and on said substrate;

forming a nitride layer on said pad oxide layer;

forming plural trenches on said substrate by etching back said nitride layer, said pad oxide layer, said first doped region and said substrate, namely, said first doped region being separated to form plural regions to be bit lines of said Trench Mask ROM cell;

forming a gate oxide on each said trench;

removing said nitride layer;

forming a polysilicon layer on said gate oxide layer and said pad oxide layer; and forming plural second doped regions beneath said gate oxide layer and beneath said gate oxide layer on bottoms of selected trenches to form coding regions of said Trench Mask ROM cell.

8. The method according to claim 7, wherein said first and second doped regions are doped with ions selected from a group consisting of arsenic and phosphorus ions.

9. The method according to claim 7, wherein said first and second doped regions are formed using ion-implanting steps.

10. The method according to claim 9, wherein the energies in said ion-implanting step for forming said first doped regions are 40 to 100 KeV for arsenic ions and 30 to 80 KeV for phosphorus ions.

11. The method according to claim 9, wherein the energies in said ion-implanting step for forming said second doped regions are 150 to 1,000 KeV for arsenic ions and 90 to 1,000 KeV for phosphorus ions.

12. The method according to claim 7, wherein a thickness of said gate oxide layer is about 50 to 200 angstroms.

* * * * *